United States Patent [19]
Momohara

[11] Patent Number: 5,923,600
[45] Date of Patent: Jul. 13, 1999

[54] SEMICONDUCTOR DEVICE AND TEST METHOD AND APPARATUS FOR SEMICONDUCTOR DEVICE

[75] Inventor: Tomomi Momohara, Yokohama, Japan

[73] Assignee: Kabushiki Kaisha Toshiba, Tokyo, Japan

[21] Appl. No.: 08/927,791

[22] Filed: Sep. 11, 1997

[30] Foreign Application Priority Data

Oct. 2, 1996 [JP] Japan .................................. 8-261971

[51] Int. Cl.$^6$ ....................................................... G11C 7/00
[52] U.S. Cl. ............... 365/201; 365/230.03; 365/230.06; 365/189.05
[58] Field of Search ........................ 365/230.01, 230.03, 365/230.06, 189.05, 201, 189.01

[56] References Cited

U.S. PATENT DOCUMENTS

| | | | |
|---|---|---|---|
| 4,752,929 | 6/1988 | Kantz et al. ............................ | 365/201 |
| 5,381,421 | 1/1995 | Dickol et al. .......................... | 371/22.1 |
| 5,668,774 | 9/1997 | Furutani ................................ | 365/233 |
| 5,724,297 | 3/1998 | Noda et al. ............................. | 365/226 |
| 5,793,686 | 8/1998 | Furutani et al. ....................... | 365/201 |

FOREIGN PATENT DOCUMENTS 359175094 10/1984 Japan .

*Primary Examiner*—Viet Q. Nguyen
*Attorney, Agent, or Firm*—Loeb & Loeb LLP

[57] ABSTRACT

A semiconductor device having a multi-bit data input/output terminal is tested or inspected by use of a conventional testing apparatus. The semiconductor device is divided into a number of memory cell blocks, and test data comprised of a limited number of bits corresponding to the number of bits of the data I/O terminal of each memory cell block is supplied to each memory cell block. Each memory cell block has a buffer circuit located between adjacent ones of the data buses corresponding to the respective I/O terminals. Each memory cell block also has first to test buffer circuits. The test buffer circuits include an i-th test buffer circuit (i a natural number in the range of) which has one connected to the first data bus and the other end connected to the data bus. The first to n-th buffer circuits and the first to test buffer circuits are switched between active and inactive by controlling timing signals supplied thereto.

8 Claims, 8 Drawing Sheets

SEMICONDUCTOR DEVICE AND TEST METHOD AND APPARATUS FOR SEMICONDUCTOR DEVICE

BACKGROUND OF THE INVENTION

The present invention relates to a semiconductor device having a multi-bit data input/output terminal (hereinafter referred to as "data I/O terminal"). The present invention also relates to a method and apparatus for testing and inspecting the semiconductor device by dividing the memory of the semiconductor device into a number of memory blocks and executing a test by use of a conventional testing circuit which outputs test data of a limited number of bits corresponding to the number of bits of the data I/O terminal of each memory block.

In recent years, more and more CPUs capable of processing data of a larger number of bits have been developed, and more and more higher-speed peripheral computer devices have been developed. In accordance with this trend, the main memory of a computer and the memories of its peripheral devices are also required to operate at high speed without consuming high power. They are also required to operate at high frequency and process data of a large number of bits.

In order to evaluate the function of a memory employed in a system, a performance evaluating standard generally referred to as Fill Frequencies is proposed and widely used as guidelines for product development and system development. To satisfy the values prescribed in the Fill Frequencies and enable data transfer of a few gigabytes per second, for example, it is demanded that the number of bits of data I/O terminals be increased. For example, 32-bit data I/O terminals are required in the case of a 64M-DRAM, and 64- to 128-bit data I/O terminals are required in the case of a 1G-DRAM.

With an increase in the storage capacity of a memory, a longer time is needed to test a semiconductor device. In an effort to shorten the test time, two methods are available at present. In one of the methods, a test device itself is incorporated in a semiconductor device. In the other methods, a simultaneous measurement system is adopted which tests a number of semiconductor devices at one time.

An MBT (multi-bit test) method is known as the former method. This method tests a semiconductor device by checking whether or not the bit configuration of data to be examined coincides with that of test data.

In the simultaneous measurement system, the time actually required for testing one semiconductor device is shortened by increasing the number of semiconductor devices placed in one test station for simultaneous measurement or by increasing the number of test stations provided for the test system (e.g., from two stations to four stations).

In order to test a product having a larger number of data I/O terminals, it may be possible to increase the number of data pins provided for a test station. However, this method necessitates investment in plant and equipment, increasing the cost for test. In addition, if a larger number of data I/O terminals are provided, the number of devices that can be simultaneously measured in one station is inevitably small.

Under the above circumstances, there is a demand for improved test devices.

Many of existing semiconductor devices have 8-bit or 16-bit data I/O terminals. The testing apparatuses owned by manufacturers are designed to correspond to such a number of bits, and can simultaneously test a large number of devices whose data I/O terminals correspond to the number of bits.

If the data I/O terminals of semiconductor devices provided from now on comprise an increased number of bits, it will be necessary to increase the number of data pins provided for one test station. To be more specific, a new data I/O driver has to be added to the testing apparatus of an existing simultaneous measurement system, and a computer circuit has to be additionally provided. This cannot be done without incurring high expenses for investment in plant and equipment.

On the other hand, the MBT method has problems in that test data is not necessarily reliable. To be more specific, the unit number of bits (i.e., the number of bits which can be processed at one time) increases in accordance with an increase in the storage capacity of a memory. That is, the unit number of bits is "16" in the case of a 16M-DRAM, "32" in the case of a 64M-DRAM, "64" in the case of a 256M-DRAM, and "128" in the case of a 1G-DRAM. If the unit number of bits increases in this manner, the test data may not be necessarily reliable due to cell interference, bit line interference, or the like. In addition, if a redundancy circuit is used in place of a defective address, data check has to be executed again bit by bit.

Moreover, the ratio of the area of the test device to the area of the entire chip (the ratio is generally referred to as "overhead") is large. The test methods in which a test device is incorporated in a semiconductor device include not only the MBT method mentioned above but also an LMT (line mode test) method and an MMT (merged match test) method, but these methods also have such problems as mentioned above.

BRIEF SUMMARY OF THE INVENTION

The present invention has been developed in an effort to solve the problems mentioned above, and an object of the invention is to provide a semiconductor device which has data input/output terminals with increased bits, which enables a test to be executed at low cost, and which has a small-valued overhead and can therefore be manufactured at low cost. Another object of the present invention is to provide a test method and apparatus for testing and inspecting the semiconductor device by dividing the memory of the semiconductor device into a number of memory cell blocks and simultaneously measuring the test data output from each memory cell block by use of a conventional testing circuit which outputs test data of a limited number of bits corresponding to the number of bits of the data I/O terminal of each memory cell block.

To attain the above objects, the present invention provides a semiconductor device comprising:

first to n-th memory blocks to which first to n-th m-bit data lines are connected, respectively;

first to n-th m-bit data buses having first ends which are connected to data I/O terminals, respectively;

first to n-th buffer circuits having first ends which are connected in correspondence to the first to n-th data lines, respectively, and second ends which are connected in correspondence to second ends of the first to n-th m-bit data buses;

first to (n−1)th test buffer circuits including an i-th test buffer circuit (i: a natural number in the range of 1 to (n+1)), the i-th test buffer circuit having a first end connected to one of the first to n-th data buses and a second end connected to either the first data bus or an (i+1)th data bus; and a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state.

The present invention also provides a semiconductor device comprising:

first to n-th memory blocks to which first to n-th m-bit data lines are connected, respectively;

first to n-th m-bit data buses having first ends which are connected to data I/O terminals, respectively;

first to n-th buffer circuits having first ends which are connected in correspondence to the first to n-th data lines, respectively, and second ends which are connected in correspondence to second ends of the first to n-th data buses;

first to (n−1)th test buffer circuits including an i-th test buffer circuit (i: a natural number in the range of 1 to (n−1)), the i-th test buffer circuit having a first end connected to one of the first to n-th m-bit data buses and a second end connected to either the first data bus or an (i+1)th data bus;

a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state; and a CPU circuit connected to each of the first to n-th m-bit data buses and having an input/output terminal through which (m×n) data are input or output, the CPU circuit supplying a control signal to the control circuit.

The present invention further provides a method for inspecting a semiconductor device comprising:

first to n-th memory blocks to which first to n-th m-bit data lines are connected, respectively;

first to n-th m-bit data buses having first ends which are connected to data I/O terminals, respectively;

first to n-th buffer circuits having first ends which are connected in correspondence to the first to n-th data lines and second ends which are connected in correspondence to the first to n-th m-bit data buses;

first to (n−1)th test buffer circuits including an i-th test buffer circuit (i: a natural number in the range of 1 to (n−1)), the i-th test buffer circuit having a first end connected to one of the first to n-th m-bit data buses and a second end connected to either the first data bus or an (i+1)th data bus; and a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state, the method comprising the steps of:

supplying test data to one of the first to n-th m-bit data buses by way of a corresponding one of the data I/O terminals;

turning on the first to (n−1)th test buffer circuits;

turning on the first to n-th buffer circuits, arranged between the first to n-th m-bit data buses and the m-bit data lines of each of the memory blocks, so as to simultaneously write the test data in the first to n-th memory blocks;

turning on the first buffer circuit and reading out the test data from the first memory block in a state where the first to (n−1)th test buffer circuits are kept off;

reading out the test data from an i-th memory block (i: a natural number in the range of 2 to n) in a state where the i-th buffer circuit and the (i−1)th test buffer circuit are kept on and remaining ones of the test buffer circuits and the first buffer circuit are kept off; and testing the memory blocks by sequentially reading out the test data from the first to n-th memory blocks through the first data bus.

The present invention further provides a method for inspecting a semiconductor device comprising:

first to n-th memory blocks to which first to n-th m-bit data lines are connected, respectively;

first to n-th m-bit data buses having first ends which are connected to data I/O terminals, respectively;

first to n-th buffer circuits having first ends which are connected in correspondence to the first to n-th data lines and second ends which are connected in correspondence to the first to n-th m-bit data buses;

first to (n−1)th test buffer circuits including an i-th test buffer circuit (i: a natural number in the range of 1 to (n−1)), the i-th test buffer circuit having a first end connected to one of the first to n-th m-bit data buses and a second end connected to either the first data bus or an (i+1)th data bus;

a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state; and a CPU circuit connected to each of the first to n-th data buses and having an input/output terminal through which (m×n)-bit data are input or output, the CPU circuit supplying a control signal to the control circuit, the method comprising the steps of:

supplying test data to the first m-bit data bus by way of a corresponding one of the data I/O terminals, so as to write the test data in the first memory block;

turning on the first buffer circuit in a state where the first to (n−1)th test buffer circuits are kept off, the first buffer circuit having a first end connected to the first m-bit data bus and a second end connected to the m-bit data line of the first memory block;

supplying test data from the data I/O terminal to one of the m-bit data buses, so as to write the test data in an i-th memory block (i: a natural number in the range of 2 to n);

turning on the (i−1)th test buffer circuit and the i-th buffer circuit in a state where the first buffer circuit and the test buffer circuits other than the (i−1)th test buffer circuit are kept off, the i-th buffer circuit having a first end which is connected to the i-th data bus and a second end which is connected to the m-bit data line of the i-th memory block, writing the test data sequentially in the first to n-th memory blocks;

reading out the test data from the first memory block by turning on the first buffer circuit in a state where the first to (n−1)th test buffer circuits are kept off;

reading out the test data from an i-th memory block (i: a natural number in the range of 2 to n) in a state where the i-th buffer circuit and the (i−1)th test buffer circuit are kept on and remaining ones of the test buffer circuits and the first buffer circuit are kept off; and testing the memory blocks by sequentially reading out the test data from the first to n-th memory blocks by way of the first data bus.

The present invention further provides an apparatus for inspecting a plurality of semiconductor devices each comprising:

first to n-th memory blocks to which first to n-th m-bit data lines connected to the first to n-th memory blocks, respectively;

first to n-th m-bit data buses having first ends which are connected to data I/O terminals, respectively;

first to n-th buffer circuits having first ends which are connected in correspondence to the first to n-th data lines and second ends which are connected in correspondence to the first to n-th data buses;

first to (n−1)th test buffer circuits including an i-th test buffer circuit (i: a natural number in the range of 1 to (n−1)), the i-th test buffer circuit having a first end connected to one of the first to n-th data buses and a second end connected to either the first data bus or an (i+1)th data bus; and a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state, the apparatus having:

input/output terminals corresponding in number to test I/O terminals of the semiconductor devices; and means for generating timing signals to be supplied to the first to n-th buffer circuits and the first to (n−1)th test buffer circuits.

The present invention tests and inspects a semiconductor device by dividing the memory of the semiconductor device into a number of memory blocks and simultaneously measuring the test data output from each memory block by use of a conventional test device which outputs data in correspondence to the number of bits of the data I/O terminal of each memory cell block. According to the present invention, the data read out from the memory cell blocks are sequentially checked, and the use of the conventional test device does not entail an increase in the cost required for the test. In addition, the circuit provided in the semiconductor device is small in size, and the overhead of the test device is small, thus enabling low-cost manufacture of semiconductor devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

DETAILED DESCRIPTION OF THE INVENTION

Embodiments of the present invention will now be described with reference to the accompanying drawings.

Figure 1:
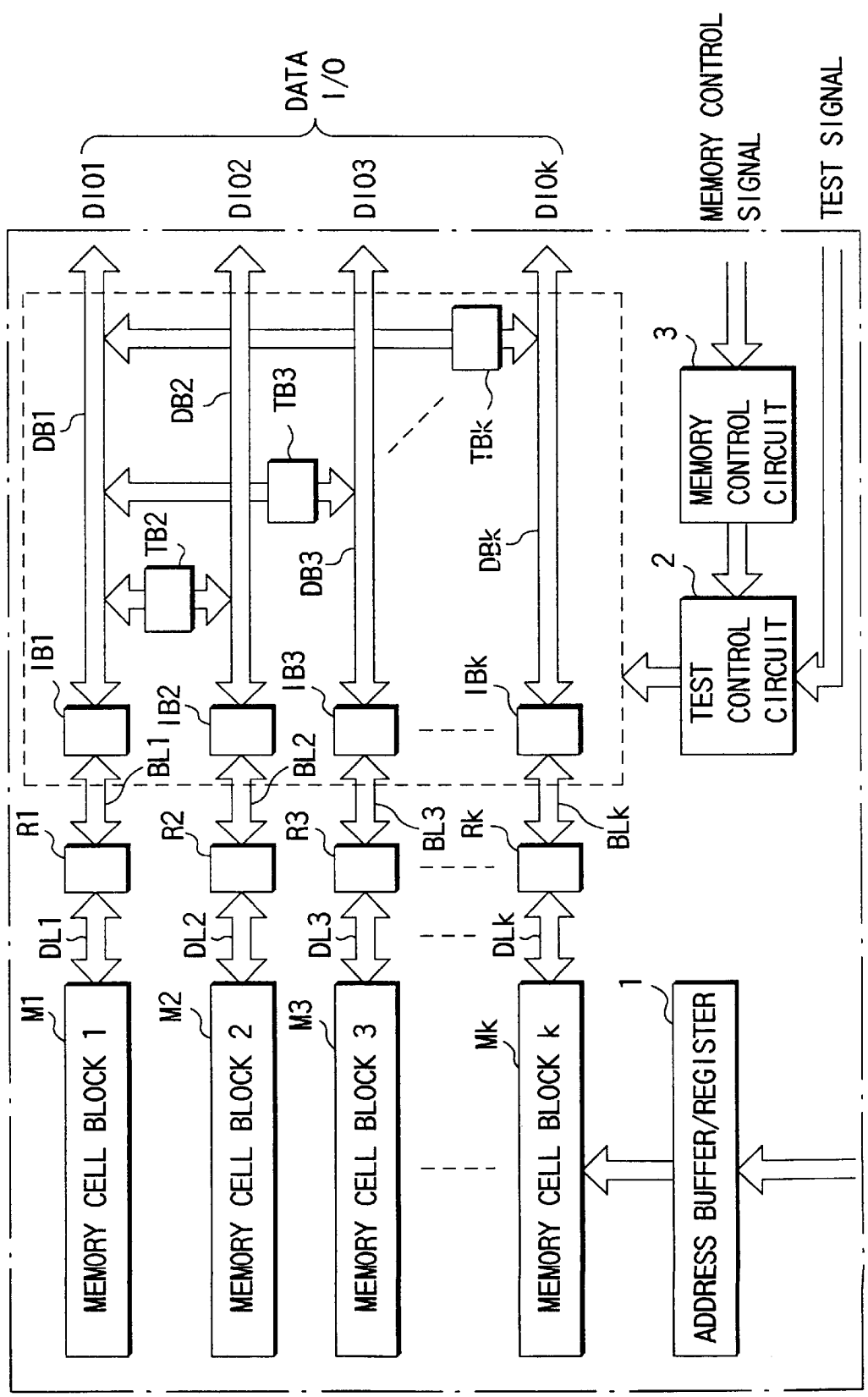
FIG. 1 is a block circuit diagram showing a semiconductor device that incorporates a test device of embodying the present invention.

FIG. 1 is a block circuit diagram showing a semiconductor device which is provided with a test device according to the first embodiment of the present invention.

The semiconductor device shown in FIG. 1 is a semiconductor memory circuit comprising a multi-bit data I/O terminal. The data I/O terminal is an n-bit terminal (n: a natural number). For simplicity, it is assumed that the n-bit terminal is made up of m-bit data I/O terminals DIO1 to DIOk. (m and k are natural numbers, and their mathematical product is n, i.e., n=m×k). The m-bit data buses connected to the data I/O terminals DIO1 to DIOk will be denoted by DB1 to DBk, respectively.

In the semiconductor memory circuit shown in FIG. 1, the input/output terminals of memory cell blocks M1 to Mk are connected to the first terminals of data registers R1 to Rk by way of m-bit data lines DL1 to DLk, respectively. The second terminals of data registers R1 to Rk are connected to the first terminals of buffer circuits IB1 to IBk, respectively.

The second terminals of buffer circuits IB1 to Ibk are connected to data I/O terminals DIO1 to DIOk through data buses DB1 to DBk, respectively.

Test buffer circuits TB2 to TBk are jointly connected to the first data bus DB1 at one end. At the other end, Test buffer circuits TB2 to TBk are connected to data buses DB2 to DBk, respectively.

Figure 3:
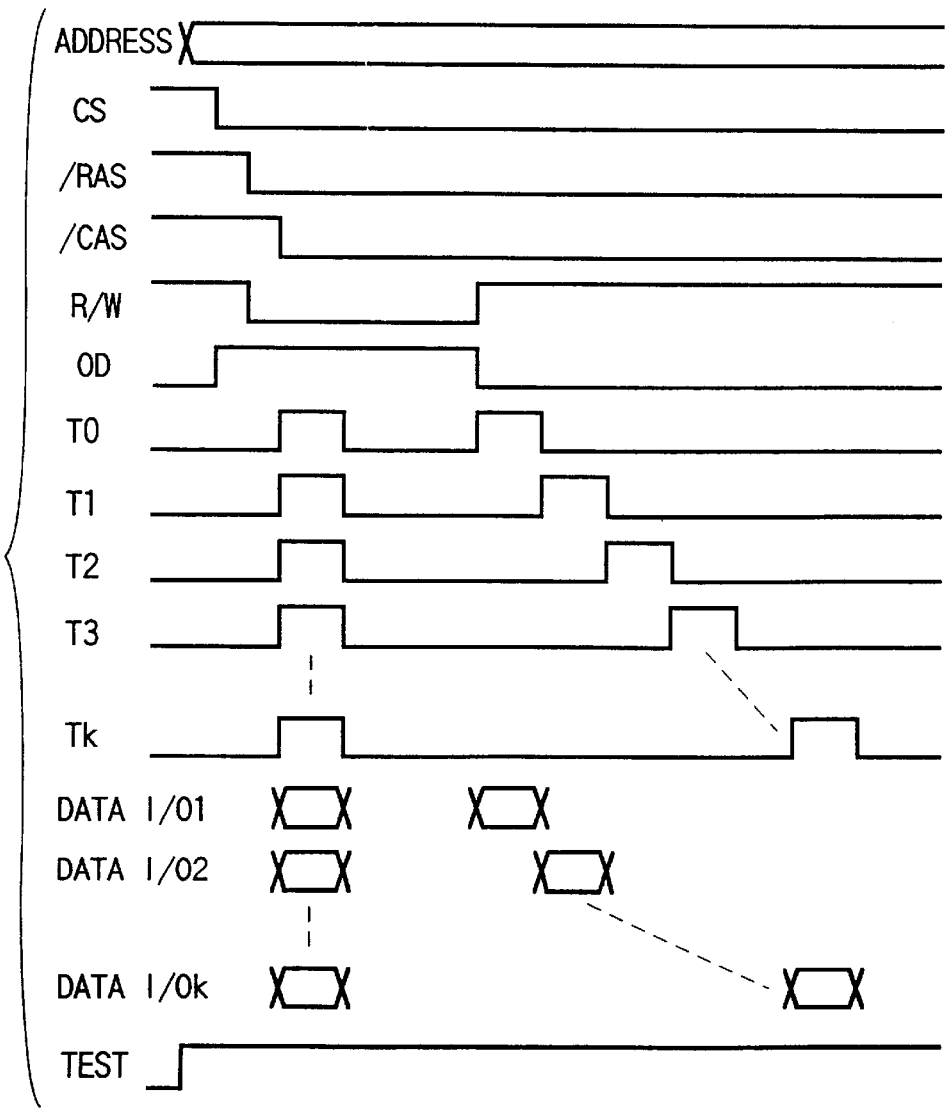
FIG. 3 is a test timing chart of the semiconductor device of the present invention.

An output disable signal OD, a read/write signal R/W and chip select signal CS, such as those shown in FIG. 3, are supplied to an input terminal of a test control circuit 2, either directly or by way of a memory control circuit 3. In accordance with the type of a memory (a DRAM, an SRAM, etc.), the chip select signal CS becomes signal /RAS, signal /CAS, signal /CE or signal CE2. (The symbol "/" is used to represent an inverted signal.) In the description below, signal R/W, signal OD and signal CS will be referred to as control signals.

Signal TEST/NORMAL and test timing signals T1 to Tk are also supplied to the input terminal of the test control circuit 2. In the description below, signal TEST and timing signals T1 to Tk will be referred to simply as test signals.

The test control circuit 2 transfers timing signals T1 to Tk to the buffer circuits IB1 to IBk and the test buffer circuits TB2 to TBk in accordance with the memory control signal and signal TEST, so as to control the operations of the buffer circuits and the test buffer circuits.

An external address signal is supplied to the input terminal of an address buffer/register circuit 1. The output terminal of this circuit 1 is connected to the address lines of the memory blocks M1 to Mk.

The test operation according to the embodiment will be described.

First of all, a description will be given of the method in which the same test data is simultaneously written in all memory cell blocks M1 to Mk and is then read out from each of the memory blocks.

Figure 2:
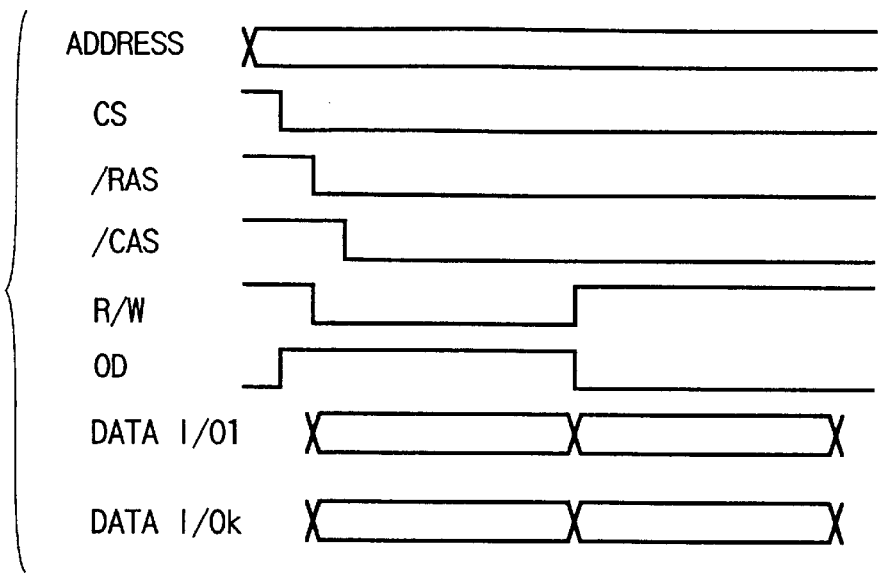
FIG. 2 is a test timing chart of a conventional semiconductor device.

FIG. 2 is a test timing chart of a conventional semiconductor device. For simplicity, it is assumed that the conventional semiconductor device has such a circuit configuration as shown in FIG. 1, except that the buffer circuits 1B1 to 1Bk, the test buffer circuits TB2 to TBk and the test control circuit 2 are omitted.

In the case shown in FIG. 2, n-bit test data are simultaneously written in memory cell blocks M1 to Mk from the data I/O terminal, and is then read out therefrom simultaneously.

FIG. 3 is a test timing chart of a semiconductor device that is provided with the test device (FIG. 1) according to an embodiment of the present invention.

First of all, only the m-bit data I/O terminal DIO1 is connected to the test device (not shown).

Then, signal TEST/NORMAL is set in the "H" level, for the selection of the test mode.

Test data is written in the memory cell. To be more specific, an address signal is first supplied, then a chip select signal CS, signal /RAS, signal /CAS, and signal R/W are set in the low level, and signal OD is set in the state enabling data entry.

All timing signals T1 to Tk are set in the high level such that the test buffer circuits TB2 to TBk and the buffer circuits IB1 to IBk are in the data entry mode, i.e., the mode in which passage of data is allowed. In this state, m-bit test data is supplied to the data I/O terminal DIO1. As a result, the same test data is written in the memory cell blocks M1 to Mk.

Thereafter, the test data are read out from the memory cell blocks M1 to Mk. To be more specific, an address signal is supplied, and signal/RAS and signal/CAS are set in the low level, while signal R/W is set in the high level. In this state, the data in the memory cell blocks are output to the register circuits R1 to Rk.

Although signal OD is in the state corresponding to the data output mode, timing signals T1 to Tk are in the low level, and the data buffer circuits IB1 to IBk are off. Accordingly, no data is output from the data buffer circuits IB1 to IBk.

Then, one of the timing signals T1 to Tk is set in the high level, and the data stored in one of the register circuits R1 to Rk is output to the m-bit data I/O terminal DIO1.

For example, only signal T1 is set in the high level, and only buffer circuit IB1 is turned on, so that the data in register circuit R1 is output to data I/O terminal DIO1. Next, only signal T2 is set in the high level, and the buffer circuit IB2 and the test buffer circuit TB2 are turned on, so that the data in register circuit R2 is output to data I/O terminal DIO1. A similar operation is repeated thereafter. It should be noted that the data in register circuits R1 to Rk do not mix with each other.

The test data mentioned above may be independently written in each of the memory cell blocks, and then read out independently from each of the memory cell blocks.

In this case, the test data is sent to the data bus DB1, and the buffer circuits and the test buffer circuits are controlled in such a manner that an arbitrary memory cell block is connected to the data bus. The test data is written in this memory cell block. This writing operation is repeated until the test data is written in all the memory blocks M1 to Mk.

The data read operation is performed in accordance with the test timing chart shown in FIG. 3.

As in the manner described above, the present invention tests and inspects a semiconductor device having a multi-bit data I/O terminal by dividing the memory of the semiconductor device into a number of memory cell blocks and executing a test by use of a conventional test device which outputs test data of a limited number of bits corresponding to the number of bits of the data I/O terminal of each memory cell block. The data read out from the memory cell blocks can be checked sequentially. In addition, since the buffer circuits, the test buffer circuits and the test control circuit are small in size, the overhead of the entire test device is small, and the manufacturing cost is not increased by the use of the test device.

According to the embodiment mentioned above, the data input to and output from memory cell blocks need not be comprised of the same number of bits, as in the MBT system, LMT system and MMT system. Therefore, the reliability of the test is not adversely affected by the multi-bit data bus. In addition, when a redundancy circuit is tested, the replacement of redundancy columns and rows can be performed by rewriting redundancy fail addresses, thus ensuring high reliability of the test. Further, the test does not require a long time since it is executed only once.

Figure 4:
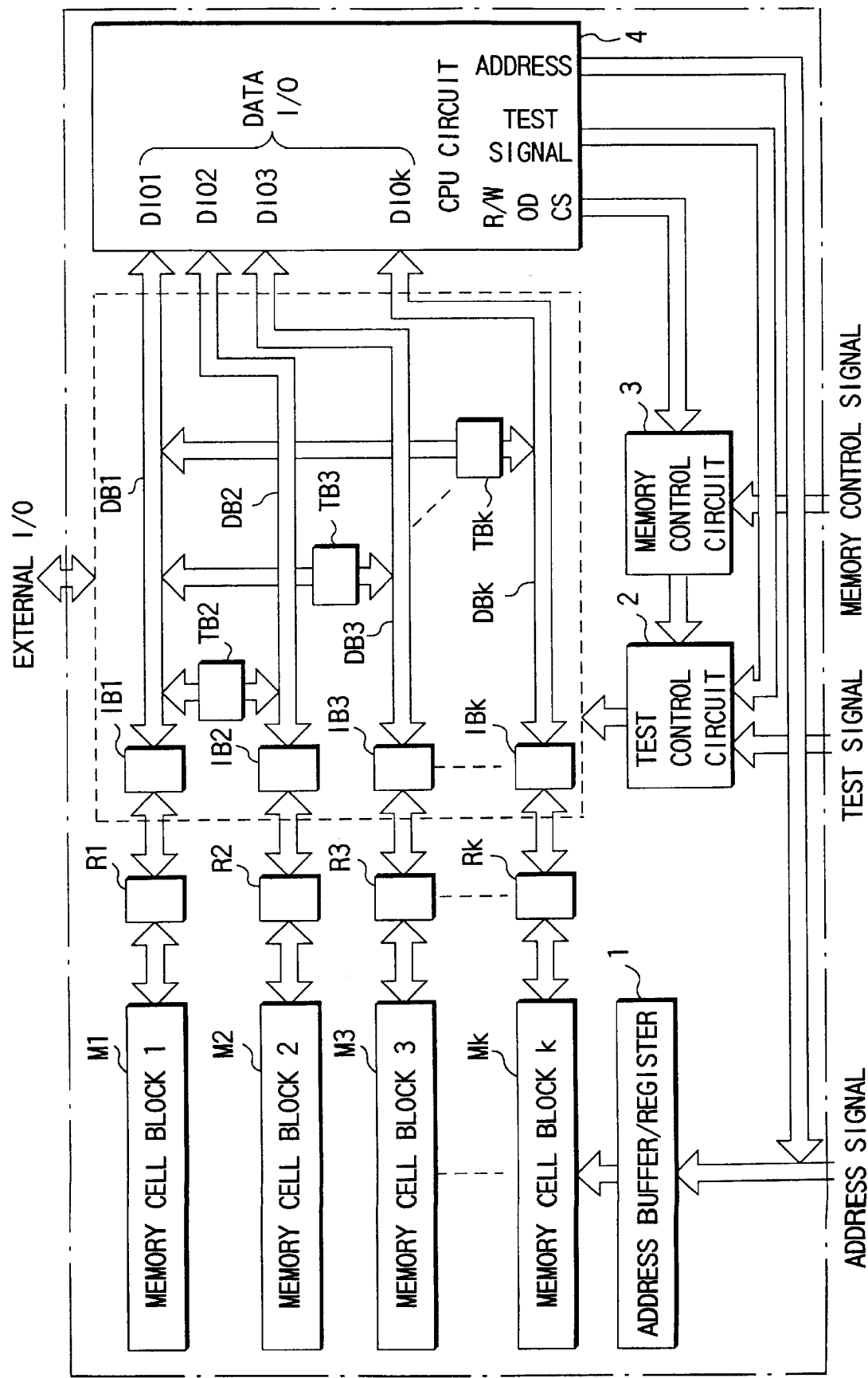
FIG. 4 is a block circuit diagram of a hybrid-memory semiconductor device provided with a test device of the present invention.

FIG. 4 shows the second embodiment of the present invention.

The second embodiment shows the case where the present invention is applied to a hybrid-memory logic semiconductor device. To be more specific, the second embodiment is obtained by adding a logic circuit, such as a CPU circuit, to the embodiment shown in FIG. 1.

In FIG. 4, the same reference numerals as used in FIG. 1 denote the corresponding structural elements, and an explanation of such elements will be omitted herein.

Referring to FIG. 4, a logic circuit, i.e., a CPU circuit 4, has an n-bit data I/O terminal. This data I/O terminal is connected to m-bit data buses DB1 to DBk (the number of which is k).

The CPU circuit 4 supplies an address signal to the input terminal of an address buffer/decoder 1, memory control signals R/W, OD and CS to a memory control circuit 3, and test signal TEST and timing signals T1 to Tk to a test control circuit 2.

The address signal, the memory control signal and test control signal may be supplied from the CPU circuit 4. Alternatively, they may be externally supplied to the respective circuits, as in the first embodiment.

The data bus DB1 is connected to an m-bit external data I/O terminal.

In the above circuit of the second embodiment, a memory is tested by supplying test signals from an external circuit. By so doing, the same advantages as those of the first embodiment are attained.

According to the second embodiment, the address signal, the memory control signal and the test control signal are supplied from the CPU circuit 4. With this structure, the second embodiment not only attains the same advantages as the first embodiment but also reduces the number of pins required.

In the case where the semiconductor memory section is of a large storage capacity and contains a redundancy circuit, its storage circuit has to be tested externally. In this case, the external data I/O terminal is connected to the input/output terminal of a testing apparatus, and the memory cell blocks M1 to Mk are tested in a similar manner to that of the first embodiment. In this manner, a semiconductor device having a multi-bit data bus can be tested by use of the conventional testing apparatus.

Figure 5:
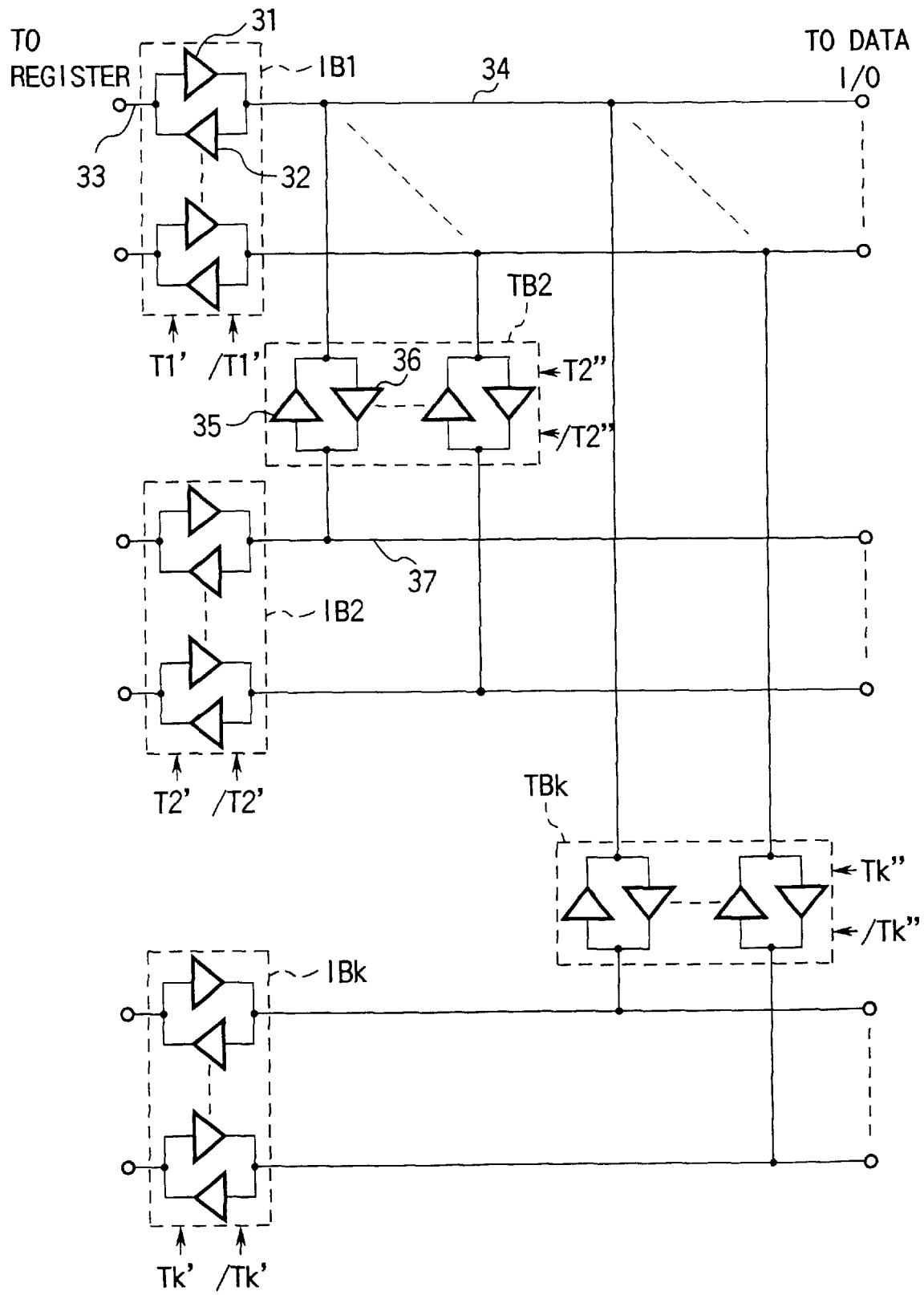
FIG. 5 is a circuit diagram showing a buffer circuit and a test buffer circuit, both of which are part of a semiconductor device-testing circuit of the present invention.

FIG. 5 is a circuit diagram showing a buffer circuit and a test buffer circuit that can be employed in the first and second embodiments mentioned above.

In the buffer circuit IB1, the input terminal of buffer 31 is connected to the data input/output terminal 33 corresponding to the uppermost bit of register R1, while the output terminal of the buffer 31 is connected to a data line 34 corresponding to the uppermost bit of data bus DB1. Likewise, the input terminal of buffer 32 is connected to the data line corresponding to the uppermost bit of data bus DB1, while the output terminal of the buffer 32 is connected to the data input/output terminal corresponding to the uppermost bit of register R1.

The buffer circuit IB1 comprises 2m buffers that are used to connect the data bus DB1 to the data input/output terminal of register R1. The 2m buffers are turned on or off on the basis of signals T1' and /T1'.

The other buffer circuits IB2 to IBk have similar configurations as buffer circuit IB1. That is, each one IBi of the buffer circuits IB2 to IBk (i: a natural number in the range of 2 to k) comprises 2m two-way buffers that are employed to connect data bus DB1 to the data input/output terminal of register Ri. Control signals T1' and /T1' are supplied to each buffer circuit IBi to control their buffers.

In test buffer circuit TB2, the input terminal of buffer 35 is connected to the uppermost bit line 37 of data bus DB2, while the output terminal of the buffer 35 is connected to the uppermost bit line 34 of data bus DB1. Likewise, the input terminal of buffer 36 is connected to the uppermost bit line 34 of data bus DB1, while the output terminal of the buffer 36 is connected to the uppermost bit line 37 of data bus DB2.

The test buffer circuit TB2 comprises 2m buffers that are used to connect data bus DB1 to data bus DB2. The 2m buffers are turned on or off on the basis of signals T2" and /T2".

The other test buffer circuits TB3 to TBk have configurations similar to that of buffer circuit TB2. That is, each one TBi of the test buffer circuits TB3 to TBk comprises 2m buffers that are employed to connect data bus DB1 to DBi. Control signals Ti" and /Ti" are supplied to each test buffer circuit TBi to control their buffers.

Figure 6:
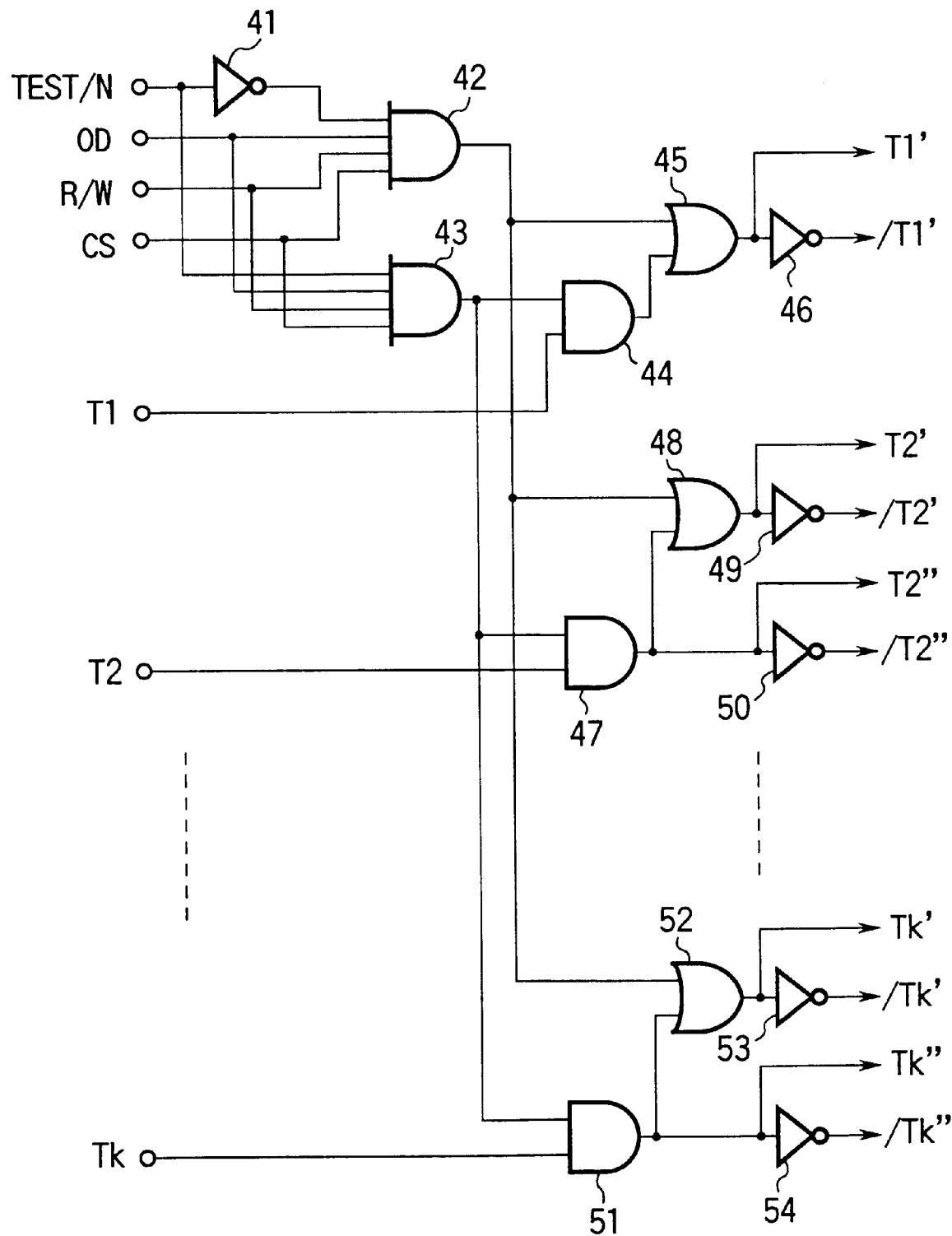
FIG. 6 is a specific circuit diagram of a control circuit depicted in FIG. 1.

FIG. 6 shows an example of the test control circuit 2 employed in the first embodiment of the present invention.

Referring to FIG. 6, signal TEST/N is supplied to the first terminal of an AND gate 42 by way of an inverter 41, and signals OD, R/W and CS are supplied to the second, third and fourth input terminal of the same AND gate 42, respectively.

Signals TEST, OD, R/W and CS are also supplied to the first, second, third and fourth input terminals of another AND gate 43, respectively.

Timing signal T1 is supplied to the first input terminal of AND gate 44, and the second input terminal of this AND gate 44 is connected to the output terminal of AND gate 42.

An output signal from OR gate 45 serves as signal T1'. The output terminal of OR gate 45 is connected to the input terminal of inverter 46, and an output signal from this inverter serves as /T1'.

Timing signal T2 is supplied to the first input terminal of AND gate 47, and the second input terminal of this AND gate 47 is connected to the output terminal of AND gate 43. The output terminal of AND gate 47 is connected to the first input terminal of OR gate 48, and the second input terminal of this OR gate 48 is connected to the output terminal of AND gate 42.

An output signal from OR gate 48 serves as signal T2'. The output terminal of OR gate 48 is connected to the input terminal of inverter 49, and an output signal from this inverter serves as /T2'. An output signal from AND gate 47 serves as signal T2".

The output terminal of AND gate 47 is connected to the input terminal of inverter 50, and an output signal from this inverter 50 serves as /T2".

To generate signals T3' to Tk', a circuit similar to the circuit made up of gates 47 to 50 is provided for each of timing signals T3 to Tk.

In the first and second embodiments mentioned above, timing signals T1 to Tk are generated externally, and a semiconductor device to be tested must comprise terminals to which the timing signals are supplied.

If a circuit for generating the timing signals T1 to Tk is formed inside the semiconductor device, the number of terminals required is small, accordingly.

Figure 7:
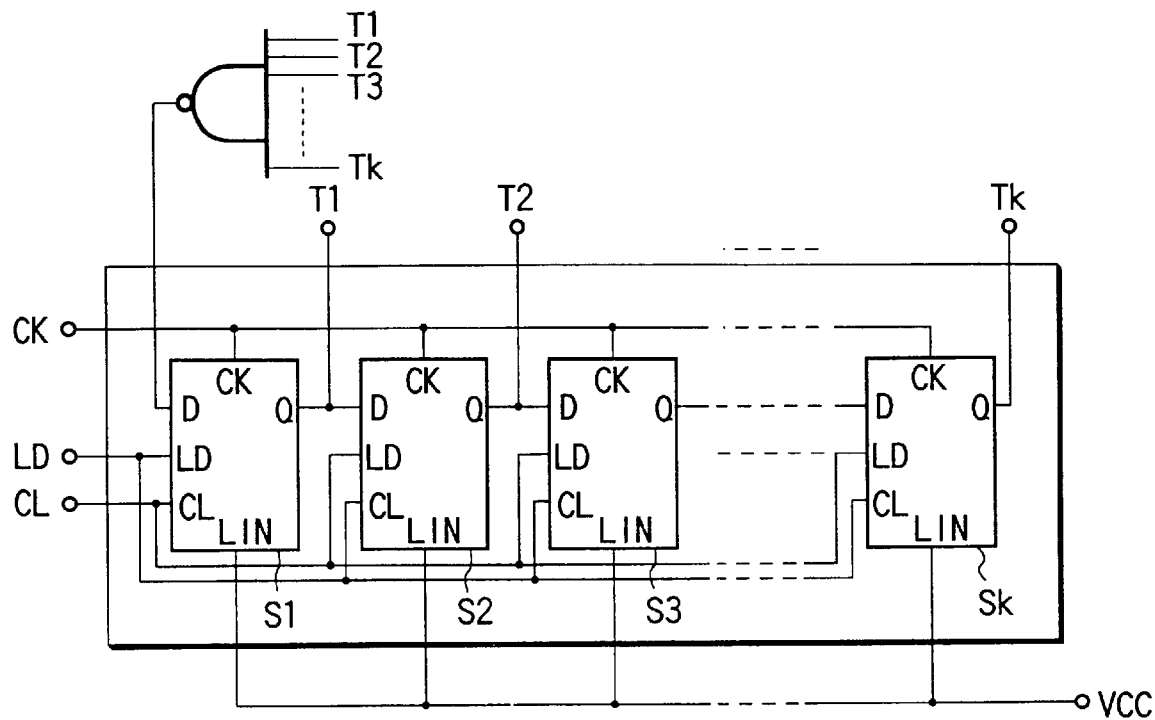
FIG. 7 shows a circuit for generating a timing signal supplied to the test device depicted in FIG. 1.

FIG. 7 shows an example of a timing signal generating circuit. As shown in FIG. 7, the timing signal generating circuit comprises k stages of shift registers S1 to Sk, each provided with clear/load terminals.

The data input terminal D of shift register S1 is connected to the output terminal of a NAND circuit, to which output signals T1–Tk of shift registers S1–Sk are supplied. The output terminal Q of shift register S1 is connected to the input terminal D of shift register S2, and the signal appearing at output terminal Q of shift register S1 serves as timing signal T1.

The output terminal Q of shift register S2 is connected to the input terminal D of shift register S3, and the signal appearing at output terminal Q of shift register S2 serves as timing signal T2. Likewise, the signal appearing at output terminal Q of shift register Sk serves as timing signal Tk.

The clock input terminals CK of shift registers S1 to Sk are supplied with the same clock signal, the clear terminals CL thereof are supplied with the same clear signal, the load terminals LD thereof are supplied with the same load signal, and the line input terminals LIN thereof are supplied with a power supply potential.

Figure 8:
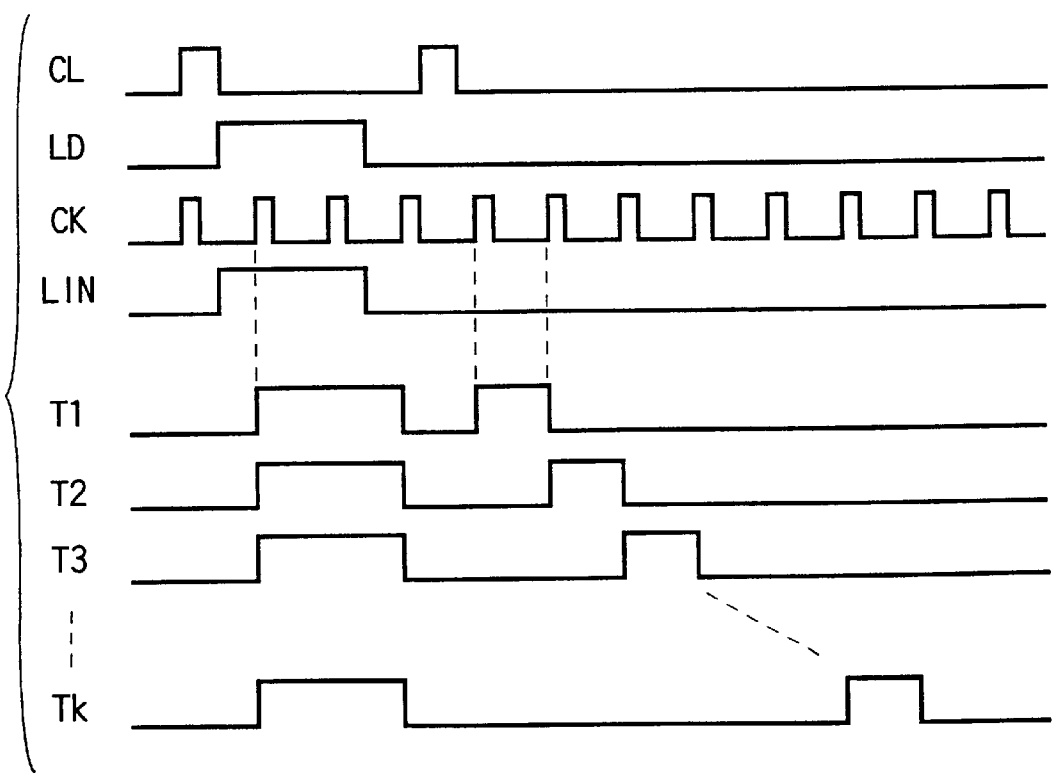
FIG. 8 is a timing chart of the timing signal generating circuit depicted in FIG. 7.

FIG. 8 is a timing chart of the timing signal generating circuit shown in FIG. 7.

When test data is written, the load signal LD is kept at the high level, and the high-level signal input to the line input terminals LIN are made to appear at the output terminals Q of the shift registers S1 to Sk.

When the test data is read, the load signal LD is kept at the low level, one-pulse signals are sequentially output as timing signals T1 to Tk.

In the first and second embodiments of the present invention, test buffer circuits TB2 to TBk are arranged between the data bus DB1 and the data buses DB2 to DBk. Needless to say, however, the present invention is not limited to this arrangement.

For example, a test buffer circuit may be arranged between the adjacent data buses. To be more specific, test buffer circuit TBi is arranged between data bus DBi-1 and data bus DBi, and when test data is written or read from memory cell block i, the test buffer circuits TB1 to TBi are turned on.

Figure 9:
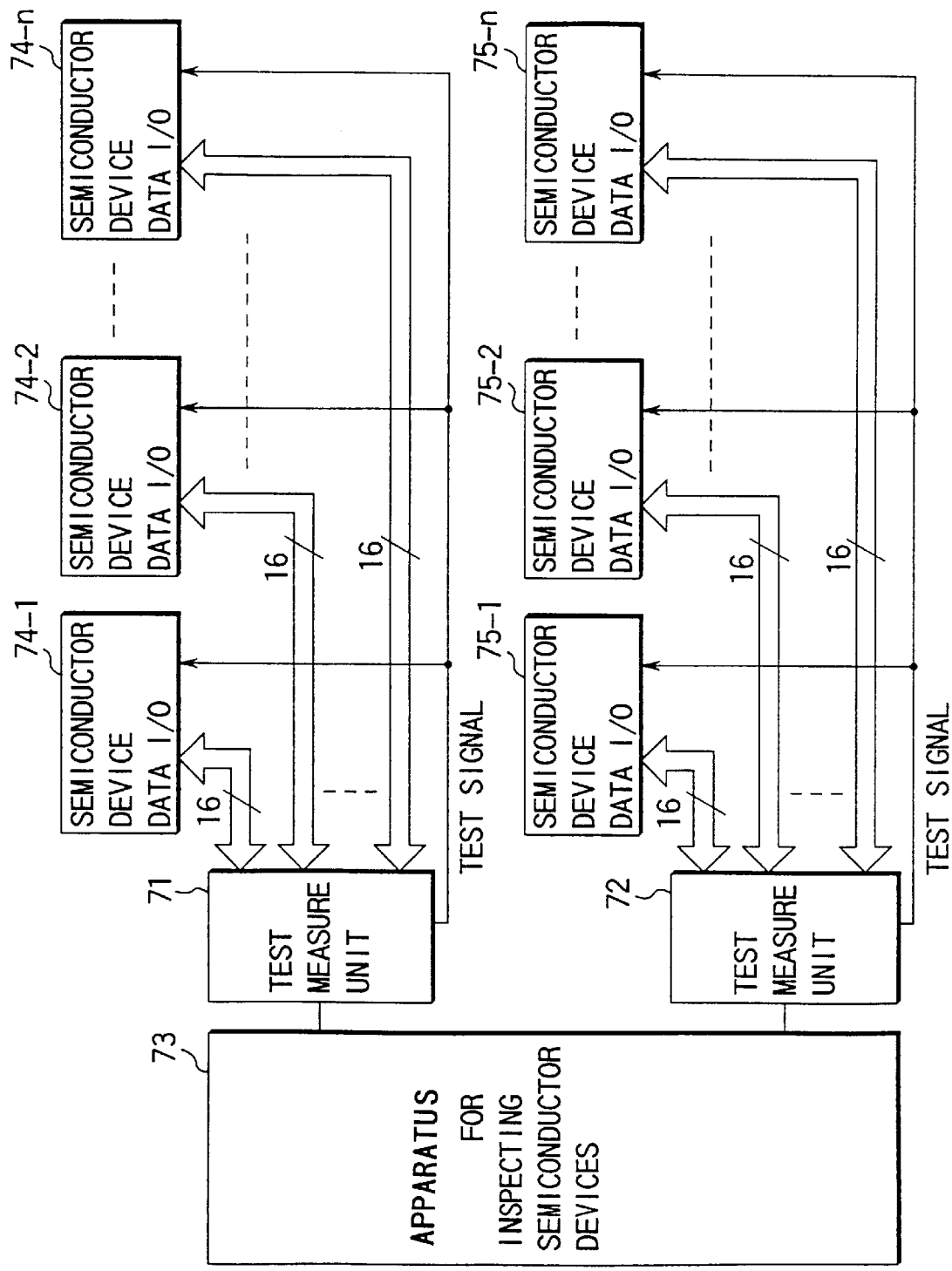
FIG. 9 shows how a semiconductor inspecting apparatus simultaneously measures a number of semiconductor devices each comprising 16-bit test data I/O terminals.

FIG. 9 shows an inspecting system comprising an apparatus 73 for inspecting semiconductor devices, each of which incorporates the test device described above.

Referring to FIG. 9, each of semiconductor devices 74-1 to 74-n and 75-1 to 75-n is provided with the buffer circuits, test buffer circuits and test control circuit described above. Each semiconductor device is also provided with a test data I/O terminal which is of 16 bits, for example.

The inspecting system shown in FIG. 9 has two test measurement sections 71 and 72, and each of these sections has 16-bit input/output terminals, the number of which is n. The input/output terminals of section 71 are connected to the test data I/O terminals of semiconductor devices 74-1 to 74-n, respectively, while the input/output terminals of section 72 are connected to the test data I/O terminals of semiconductor devices 75-1 to 75-n, respectively. All of the n semiconductor devices can be tested at one time.

Each of the test measurement sections 71 and 72 is provided with the timing signal generating circuit mentioned above, and supplies test signals to the semiconductor devices 74-1 to 74-n and 75-1 to 75-n.

The test measurement sections 71 and 72 are controlled by the inspecting apparatus 73.

Let us assume that the semiconductor devices 74-1 to 74-n and 75-1 to 75-n are storage circuits having a 128-bit data I/O terminal. In this case, each storage circuit is divided into 8 memory blocks, and data are written in these memory blocks. Next, 16-bit data are read out from the first memory blocks of the semiconductor devices 74-1 to 74-n and 75-1 to 75-n in response to timing signals T1 to Tk.

Then, data are read out from the second memory blocks. The 128-bit data are tested by repeating this operation eight times.

In the manner mentioned above, the storage circuits having a 128-bit data I/O terminal are simultaneously tested by use of a semiconductor device-testing apparatus having a 16-bit data I/O terminal, and it is not necessary to additionally employ a data I/O PIN card.

Figure 10:
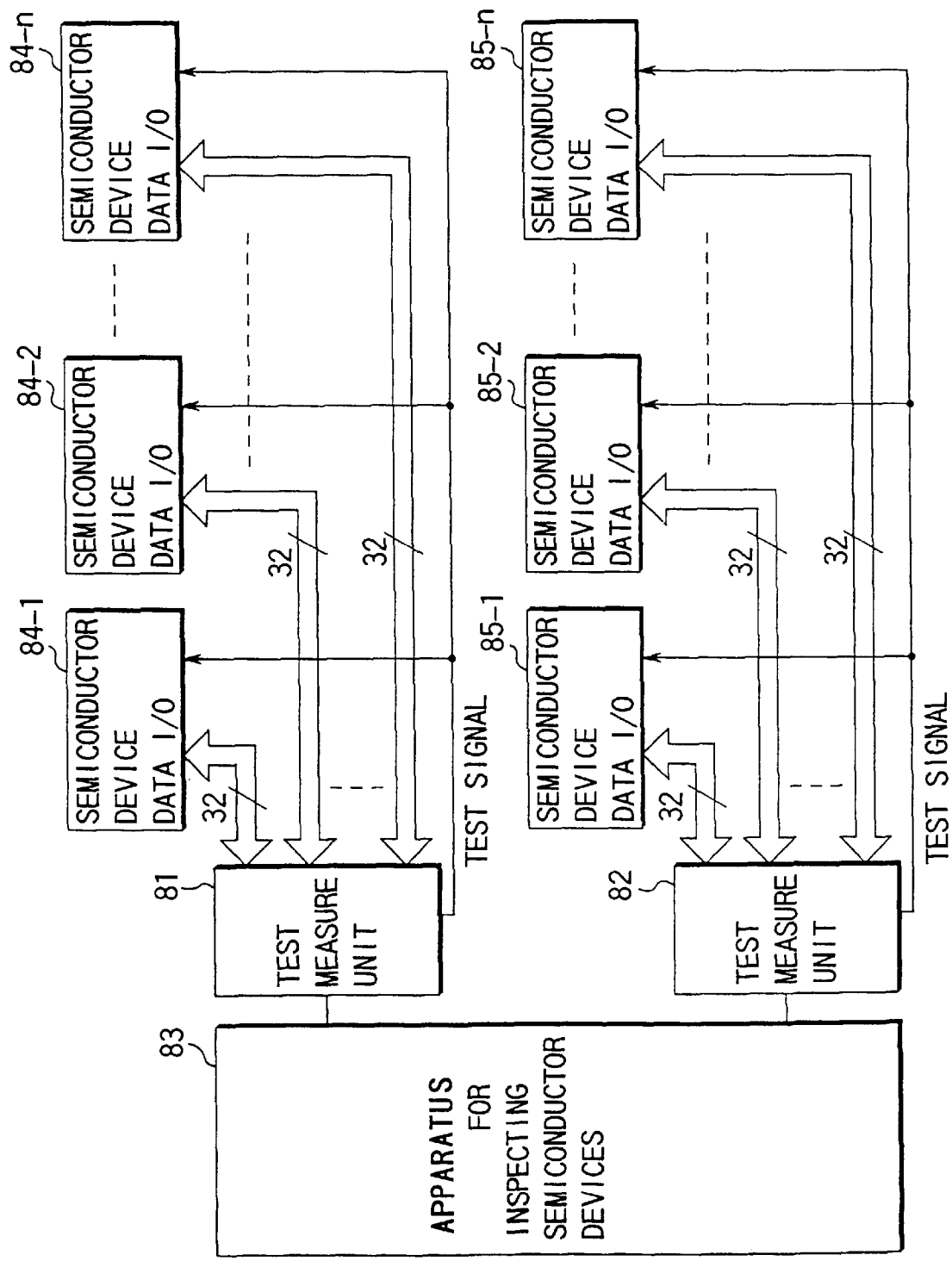
FIG. 10 shows how the semiconductor inspecting apparatus simultaneously measures a number of semiconductor devices each comprising 32-bit test data I/O terminals.

FIG. 10 shows another inspecting system comprising an apparatus 83 for inspecting semiconductor devices, each of which incorporates the test apparatus described above.

Referring to FIG. 10, each of semiconductor devices 84-1 to 84-n and 85-1 to 85-n is provided with the buffer circuits, test buffer circuits and test control circuit described above. Each semiconductor device is also provided with a test data I/O terminal which is of 32 bits, for example.

The inspecting system shown in FIG. 10 has two test measurement sections 81 and 82, and each of these sections has 32-bit input/output terminals, the number of which is n. The input/output terminals of section 81 are connected to the test data I/O terminals of semiconductor devices 84-1 to 84-n, respectively, while the input/output terminals of section 82 are connected to the test data I/O terminals of semiconductor devices 85-1 to 85-n, respectively. All of the semiconductor devices can be tested at one time.

Each of the test measurement sections 81 and 82 is provided with the timing signal generating circuit mentioned above, and supplies test signals to the semiconductor devices 84-1 to 84-n and 85-1 to 85-n.

The test measurement sections 81 and 82 are controlled by the inspecting apparatus 83.

Let us assume that the semiconductor devices 84-1 to 84-n and 85-1 to 85-n are storage circuits having a 256-bit data I/O terminal. In this case, each storage circuit is divided into 8 memory blocks, and test data are written in these memory blocks. Next, 32-bit data are read out from the first memory blocks of the semiconductor devices 84-1 to 84-n and 85-1 to 85-n in response to timing signals T1 to T8.

Then, data are read out from the second memory blocks. The 256-bit data are tested by repeating this operation eight times.

In the manner mentioned above, the storage circuits having a 256-bit data I/O terminal are simultaneously tested by use of a semiconductor device-testing apparatus having a 32-bit data I/O terminal.

The test time required by the test system shown in FIG. 10 is shorter than that required by the test system shown in FIG. 9. Unlike the test system in FIG. 9, however, the test system in FIG. 10 has to additionally employ a data I/O PIN card. Since the system shown in FIG. 10 comprises a 256-bit data I/O terminal, it is desired that the system shown in FIG. 10 be used when the additional use of a tester is necessary.

Although not shown, even a semiconductor device having a 256-bit data I/O terminal can be tested according to the present invention. In this case, a 16-bit test data I/O terminal, buffers, test buffer circuits and a test control circuit are provided for the semiconductor device, and test signals T0 to T15 are generated.

The test described in the preceding paragraph is advantageous in that a data I/O PIN card need not be provided, but requires a long test time in comparison with the case shown in FIG. 10.

In the specification, the present bus buffer system is explained by referring to a memory block. In the case where functional elements are connected to a test bus by way of the bus buffer and sequentially tested, the test information supplied to the test bus may be switched in accordance with the active or inactive state of the buffer circuit. This way for supplying the test information is applicable to a case where another functional block circuit is tested. This information supply method is particularly effective in reducing the number of test pins provided for a semiconductor device.

As described above, one of the above test methods necessitates additional use of a tester, and another test method requires a long test time. In consideration of the advantages and disadvantages of these two methods, it is possible to determine the most desirable way for testing, in such a manner as not to increase the manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:

first to n-th memory blocks to which first to n-th m-bit data lines are connected, respectively;

first to n-th m-bit data buses having first ends which are connected to data I/O terminals, respectively;

first to n-th buffer circuits having first ends which are connected in correspondence to the first to n-th data lines, respectively, and second ends which are connected in correspondence to second ends of the first to n-th m-bit data buses;

first to (n−1)th test buffer circuits including an i-th test buffer circuit (i: a natural number in range of 1 to (n−1)), said i-th test buffer circuit having a first end connected to one of the first to n-th data buses and a second end connected to one of the first data bus and an (i+1)th data bus; and a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state.

2. A semiconductor device according to claim 1, wherein said control circuit includes means for generating the timing signals supplied to the first to n-th buffer circuit and the first to (n−1)th test buffer circuits.

3. A semiconductor device comprising:

first to n-th memory blocks to which first to n-th m-bit data lines are connected, respectively;

first to n-th m-bit data buses having first ends which are connected to data I/O terminals, respectively;

first to n-th buffer circuits having first ends which are connected in correspondence to the first to n-th data lines, respectively, and second ends which are connected in correspondence to second ends of the first to n-th data buses;

first to (n−1)th test buffer circuits including an i-th test buffer circuit (i: a natural number in the range of 1 to (n−1)), said i-th test buffer circuit having a first end connected to one of the first to n-th m-bit data buses and a second end connected to one of the first data bus and an (i+1)th data bus;

a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state; and a CPU circuit connected to each of the first to n-th m-bit data buses and having an input/output terminal through which (m×n) data are input or output, said CPU circuit supplying a control signal to the control circuit.

4. A semiconductor device according to claim 3, wherein said control circuit includes means for generating the timing signals supplied to the first to n-th buffer circuit and the first to (n−1)th test buffer circuits.

5. A semiconductor device according to claim 3, wherein said CPU circuit includes means for generating said timing signals.

6. A method for inspecting a semiconductor device comprising:

first to n-th memory blocks to which first to n-th m-bit data lines are connected, respectively;

first to n-th m-bit data buses having first ends which are connected to data I/O terminals, respectively;

first to n-th buffer circuits having first ends which are connected in correspondence to the first to n-th data lines and second ends which are connected in correspondence to the first to n-th m-bit data buses;

first to (n−1)th test buffer circuits including an i-th test buffer circuit (i: a natural number in the range of 1 to (n+1)), said i-th test buffer circuit having a first end connected to one of the first to n-th m-bit data buses and a second end connected to one of the first data bus and an (i+1)th data bus; and a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state, said method comprising the steps of:

supplying test data to one of the first to n-th m-bit data buses by way of a corresponding one of the data I/O terminals;

turning on the first to (n−1)th test buffer circuits;

turning on the first to n-th buffer circuits, arranged between the first to n-th m-bit data buses and the m-bit data lines of each of the memory blocks, so as to simultaneously write the test data in the first to n-th memory blocks;

turning on the first buffer circuit and reading out the test data from the first memory block in a state where the first to (n−1)th test buffer circuits are kept off;

reading out the test data from an i-th memory block (i: a natural number in the range of 2 to n) in a state where the i-th buffer circuit and the (i−1)th test buffer circuit are kept on and remaining ones of the test buffer circuits and the first buffer circuit are kept off; and testing the memory blocks by sequentially reading out the test data from the first to n-th memory blocks through the first data bus.

7. A method for inspecting a semiconductor device comprising:

first to n-th memory blocks to which first to n-th m-bit data lines are connected, respectively;

first to n-th m-bit data buses having first ends which are connected to data I/O terminals, respectively;

first to n-th buffer circuits having first ends which are connected in correspondence to the first to n-th data lines and second ends which are connected in correspondence to the first to n-th m-bit data buses;

first to (n−1)th test buffer circuits including an i-th test buffer circuit (i: a natural number in the range of 1 to (n−1)), said i-th test buffer circuit having a first end connected to one of the first to n-th m-bit data buses and a second end connected to one of the first data bus and an (i+1)th data bus;

a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state; and a CPU circuit connected to each of the first to n-th data buses and having an input/output terminal through which (m×n)-bit data are input or output, said CPU circuit supplying a control signal to the control circuit, said method comprising the steps of:

supplying test data to the first m-bit data bus by way of a corresponding one of the data I/O terminals, so as to write the test data in the first memory block;

turning on the first buffer circuit in a state where the first to (n−1)th test buffer circuits are kept off, said first buffer circuit having a first end connected to the first m-bit data bus and a second end connected to the m-bit data line of the first memory block;

supplying test data from the data I/O terminal to one of the m-bit data buses, so as to write the test data in an i-th memory block (i: a natural number in the range of 2 to n);

turning on the (i−1)th test buffer circuit and the i-th buffer circuit in a state where the first buffer circuit and the test buffer circuit other than the (i−1)th test buffer circuit are kept off, said i-th buffer circuit having a first end which is connected to the i-th data bus and a second end which is connected to the m-bit data line of the i-th memory block, writing the test data sequentially in the first to n-th memory blocks;

reading out the test data by turning on the first buffer circuit in a state where the first to (n−1)th test buffer circuits are kept off;

reading out the test data from an i-th memory block (i: a natural number in the range of 2 to n) in a state where the i-th buffer circuit and the (i−1)th test buffer circuit are kept on and remaining ones of the test buffer circuits and the first buffer circuit are kept off; and testing the memory blocks by sequentially reading out the test data from the first to n-th memory blocks by way of the first data bus.

8. An apparatus for inspecting a plurality of semiconductor devices each comprising:

first to n-th memory blocks to which first to n-th m-bit data lines are connected, respectively;

first to n-th m-bit data buses having first ends which are connected to data I/O terminals, respectively;

first to n-th buffer circuits having first ends which are connected in correspondence to the first to n-th data lines and second ends which are connected in correspondence to the first to n-th data buses;

first to (n−1)th test buffer circuits including an i-th test buffer circuit (i: a natural number in the range of 1 to (n−1)), said i-th test buffer circuit having a first end connected to one of the first to n-th data buses and a second end connected to one of the first data bus and an (i+1)th data bus; and a control circuit for controlling timing signals supplied to the first to n-th buffer circuits and the first to (n−1)th test buffer circuits, so as to switch the first to n-th buffer circuits and the first to (n−1)th test buffer circuits between an active state and an inactive state, said apparatus having:

input/output terminals corresponding in number to test I/O terminals of the semiconductor devices; and means for generating the timing signals to be supplied to the first to n-th buffer circuits and the first to (n−1)th test buffer circuits.

* * * * *